US009466691B2

(12) United States Patent
Tseng et al.

(10) Patent No.: US 9,466,691 B2
(45) Date of Patent: Oct. 11, 2016

(54) FIN SHAPED STRUCTURE AND METHOD OF FORMING THE SAME

(71) Applicant: UNITED MICROELECTRONICS CORP., Hsin-Chu (TW)

(72) Inventors: I-Ming Tseng, Kaohsiung (TW); Rai-Min Huang, Taipei (TW); Tong-Jyun Huang, Tainan (TW); Kuan-Hsien Li, Tainan (TW); Chen-Ming Huang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 63 days.

(21) Appl. No.: 14/541,107

(22) Filed: Nov. 13, 2014

(65) Prior Publication Data

US 2016/0141387 A1    May 19, 2016

(51) Int. Cl.
| | |
|---|---|
| *H01L 21/336* | (2006.01) |
| *H01L 29/66* | (2006.01) |
| *H01L 29/78* | (2006.01) |
| *H01L 29/10* | (2006.01) |
| *H01L 21/265* | (2006.01) |

(52) U.S. Cl.
CPC ..... *H01L 29/66537* (2013.01); *H01L 29/1041* (2013.01); *H01L 29/66795* (2013.01); *H01L 29/7851* (2013.01); *H01L 21/26586* (2013.01)

(58) Field of Classification Search
CPC ............... H01L 29/66537; H01L 29/1041; H01L 29/66795; H01L 29/785
See application file for complete search history.

(56) References Cited

U.S. PATENT DOCUMENTS

| | | | |
|---|---|---|---|
| 6,888,181 B1* | 5/2005 | Liao ............... | H01L 29/66795 257/192 |
| 6,933,183 B2 | 8/2005 | Beintner et al. | |
| 7,300,837 B2 | 11/2007 | Chen et al. | |
| 2013/0252349 A1* | 9/2013 | Pradhan ........... | H01L 21/26513 438/4 |
| 2014/0008734 A1* | 1/2014 | Lu ................... | H01L 21/2652 257/401 |
| 2014/0015055 A1* | 1/2014 | Flachowsky ...... | H01L 29/7851 257/368 |
| 2014/0252475 A1* | 9/2014 | Xu .................. | H01L 29/785 257/347 |

* cited by examiner

*Primary Examiner* — Kimberly Rizkallah
*Assistant Examiner* — Maria Ligai
(74) *Attorney, Agent, or Firm* — Winston Hsu; Scott Margo

(57) ABSTRACT

A fin shaped structure and a method of forming the same, wherein the method includes forming a fin structure on a substrate. Next, an insulation layer is formed on the substrate and surrounds the fin structure, wherein the insulation layer covers a bottom portion of the fin structure to expose an exposed portion of the fin structure protruded from the insulation layer. Then, a buffer layer is formed on the fin structure. Following this, a threshold voltage implantation process is performed to penetrate through the buffer layer after forming the insulation layer, to form a first doped region on the exposed portion of the fin structure.

10 Claims, 5 Drawing Sheets

FIN SHAPED STRUCTURE AND METHOD OF FORMING THE SAME

BACKGROUND OF THE INVENTION

1. Field of the Invention

The present invention relates to a fin shaped structure and a method of forming the same, and more particularly to a fin shaped structure having a threshold voltage ($V_{th}$) region disposed at the whole exposed surface of the fin shaped structure, and a method of forming the same.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non-planar FETs, such as fin field effect transistor (FinFET) have three-dimensional structure, not only capable of increasing the contact to the gate but also improving the controlling of the channel region, such that the non-planar FETs have replaced the planar FETs and become the mainstream of the development.

However, since the properties requirements for the shrunken FinFETs become more demanding, the current fabricating process of the Fin FETs also faces more challenges. For example, it is difficult to improve the electrical properties of the FinFETs component, such as the threshold voltage thereof, thereby being poor in achieving the demand of the semiconductor component. Hence, the current forming method of the FinFETs component still requires further improvement.

SUMMARY OF THE INVENTION

It is one of the primary objectives of the present invention to provide a fin shaped structure, which can obtain preferable sensitivity of threshold voltage ($V_{th}$), and avoid fin damages.

It is another one of the primary objectives of the present invention to provide a method of forming a fin shaped structure, so as to obtain the fin shaped structure having preferred $V_{th}$ sensitivity.

To achieve the purpose described above, the present invention provides a fin shaped structure comprising a fin structure, an insulation layer and a first doped region. The fin structure is disposed on the substrate. The insulation layer is disposed on the substrate and surrounds the fin structure, wherein the insulation layer covers a bottom portion the fin structure to expose an exposed portion of the fin structure and the exposed portion of the fin structure is protruded from the insulation layer. The first doped region is disposed on whole surfaces of the exposed portion of the fin structure, and is configured to set threshold voltage.

To achieve the purpose described above, the present invention provides a method of forming a fin shaped structure, comprising following steps. A fin structure is formed on a substrate. Next, an insulation layer is formed on the substrate and surrounds the fin structure, wherein the insulation layer covers a bottom portion of the fin structure to expose an exposed portion of the fin structure protruded from the insulation layer. Then, a buffer layer is formed on the fin structure. Following this, a threshold voltage implantation process is performed to penetrate through the buffer layer after forming the insulation layer, to form a first doped region on the exposed portion of the fin structure.

Through the present invention, a fin shaped structure having preferable $V_{th}$ sensitivity may be provided via forming a threshold voltage region after performing the etching back process of the insulation layer and using the buffer layer as an implantation buffering. Thus, the present invention is sufficient to avoid fin structure damage and to achieve improved $V_{th}$ sensitivity and electric properties.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details, as well as accompanying drawings, are given to provide a thorough understanding of the invention. It will, however, be apparent to one skilled in the art that the invention may be practiced without these specific details.

Figure 1:
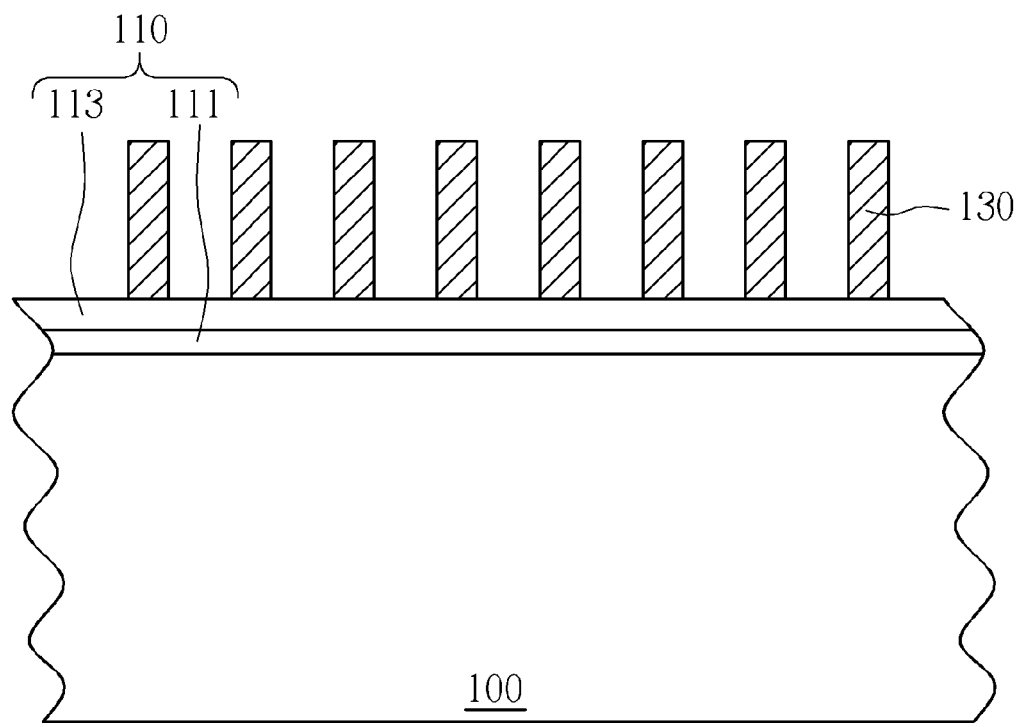
FIG. 1 to FIG. 5 are schematic diagrams illustrating a method of forming a fin shaped structure according to a first preferred embodiment of the present invention.
Figure 2:
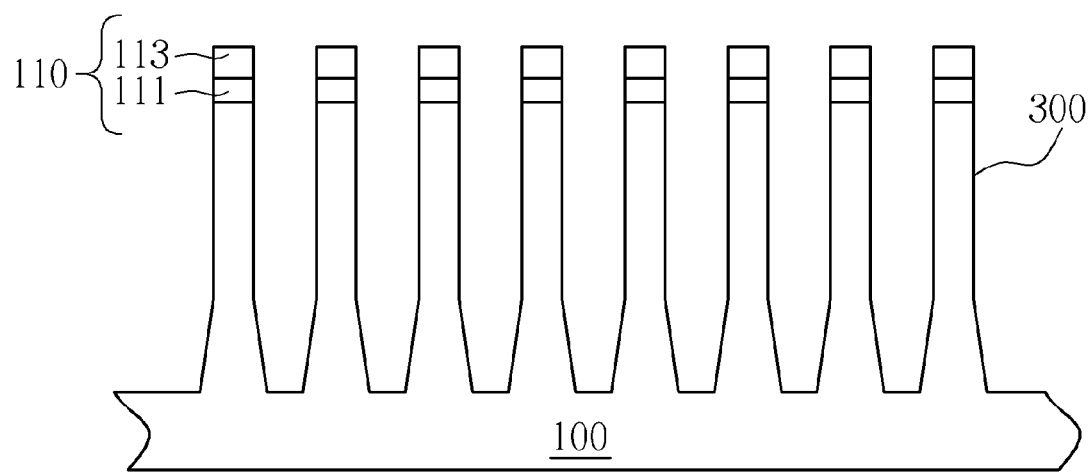

Referring to FIGS. 1-5, FIGS. 1-5 are schematic diagrams illustrating a method of forming a fin shaped structure according to a first preferred embodiment of the present invention. First of all, as shown in FIGS. 1-2, a substrate 100 is provided, and a hard mask layer 110 is formed on the substrate 100. Precisely speaking, the substrate 100 for example is a semiconductor substrate, including silicon substrate, silicon germanium substrate, silicon carbide substrate, or silicon on insulator (SOI). The hard mask layer 110 is entirely formed on a top surface of the substrate 100, for example, through a chemical vapor deposition (CVD) process or a physical vapor deposition (PVD) process. The hard mask layer 110 may include a single layer structure or a multi-layer structure, preferably including a multi-layer structure having an oxide layer and a nitride layer. In the present embodiment, the hard mask layer 110 includes a first hard mask layer 111, such as a silicon oxide layer and a second hard mask layer 113, such as a silicon nitride layer, but not limited thereto.

Next, a patterned mask layer 130 is formed on the hard mask layer 110 of the substrate 100, and which is configured to define fin structures 300 shown in FIG. 2. The patterned mask layer 130 may include a photoresist layer or a mask material, such as oxide, and may be formed by directly patterning a mask material layer (not shown in the drawings) entirely formed on the hard mask layer 110, but not limited to. In another embodiment, the patterned mask layer 130 may also be formed through a sidewall image transferring process, for example by firstly forming a plurality of mandrels (not shown in the drawings) on the substrate, forming a plurality of spacers (not shown in the drawings) surrounding each of the mandrels respectively, and removing the mandrels and using closed rectangular frames of the spacers as a mask to form the patterned mask layer 130, so as to obtain a finer pitch.

Then, the patterned mask layer 130 is used as an etching mask to carry out a fin structure etching process. Precisely, the pattern of the patterned mask layer 130 is firstly transferred to the hard mask layer 110, and the pattern of the hard mask layer 110 is then transferred to the substrate 100, for example through a dry etching, a wet etching, or the dry etching and wet etching process sequentially to form a plurality of fin structures 300 in the substrate 100. Thus, the fin structures 300 may have the same layout pattern as the patterned mask layer 130, and then the patterned mask layer 130 is removed. However, the fin structures 300 of the present invention are not limited to be formed in this manner, and in another embodiment, the fin structures 300 may also be formed through other suitable processes.

Figure 3:
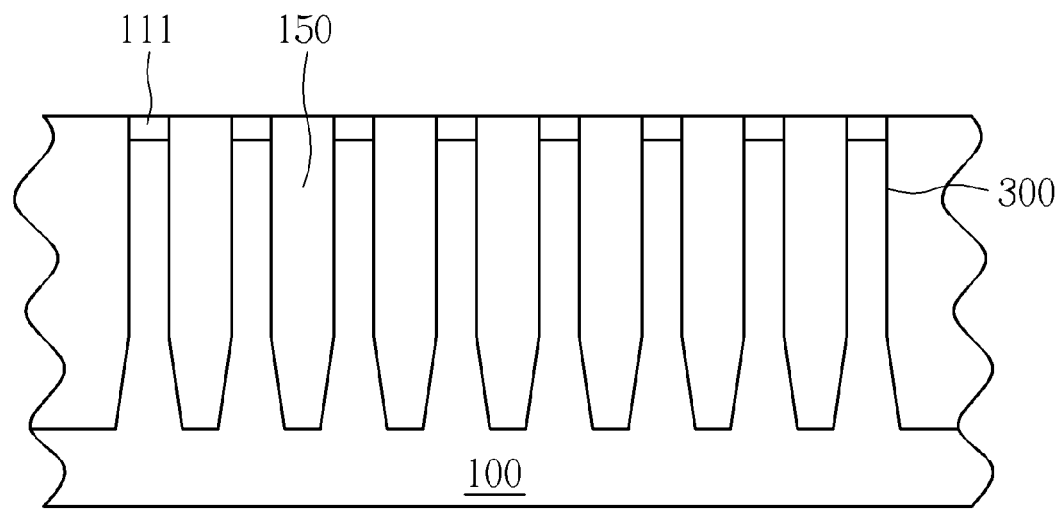

Next, as shown in FIG. 3, an insulation layer 150 is formed on the substrate 100, and filled in a space between the fin structures 300. Precisely speaking, an insulation material layer (not shown in the drawings) directly covers the fin structures 300, and then, a suitable planarization process, such as a chemical mechanical planarization or polishing (CMP) process may be performed on the primary insulation material layer, to remove a portion of the insulation material layer and at least the second hard mask layer 113 of the hard mask layer 110. In other words, at least a portion of the first hard mask layer 111 of the hard mask layer 110 remains in this step. In the present embodiment, the planarization process is performed by using the first hard mask layer 111 as a stop layer, such that, the first hard mask layer 111 remains on the fin structures 300 and the insulation layer 150 is filled in the space between the fin structures 300 and leveled up with a top surface of the first hard mask layer 111, as shown in FIG. 3.

Figure 4:
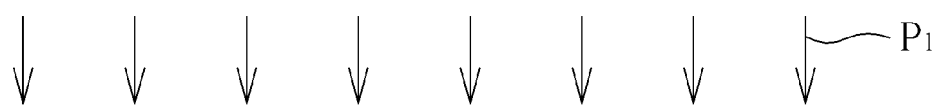
Figure 4:
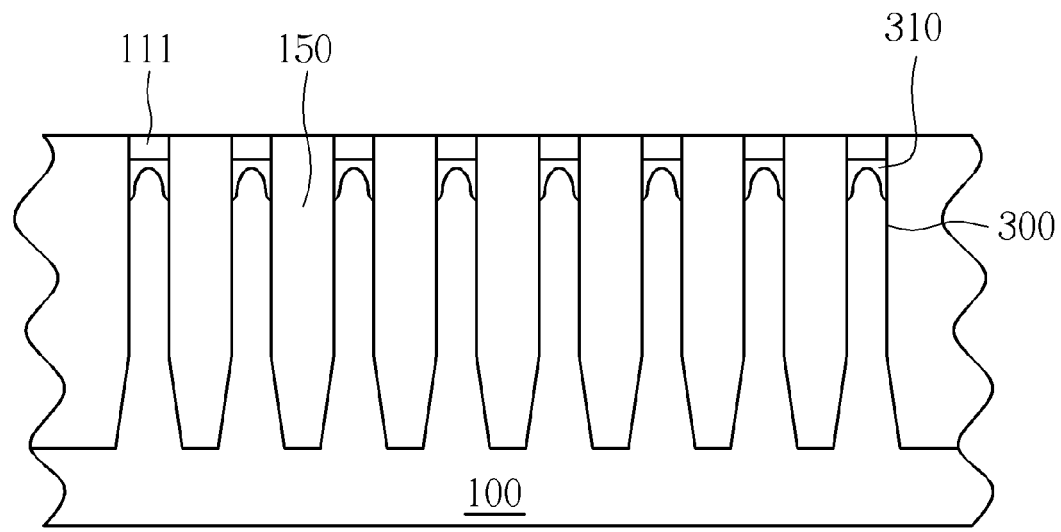

Then, as shown in FIG. 4, a threshold voltage implantation process P1 is performed to form a first doped region 310 in the fin structures 300, for adjusting a threshold voltage of the fin structures 300. Preferably, the threshold voltage implantation process P1 is performed through implanting a first dopant to penetrate through the first hard mask layer 111 on the top surfaces of the fin structures 300, thereby forming the first doped region 310 adjacent to the first hard mask layer 111, in the fin structures 300. Wherein, the first dopant of the first doped region 310 may include a proper material for adjusting the $V_{th}$ of the fin structures 300.

Figure 5:
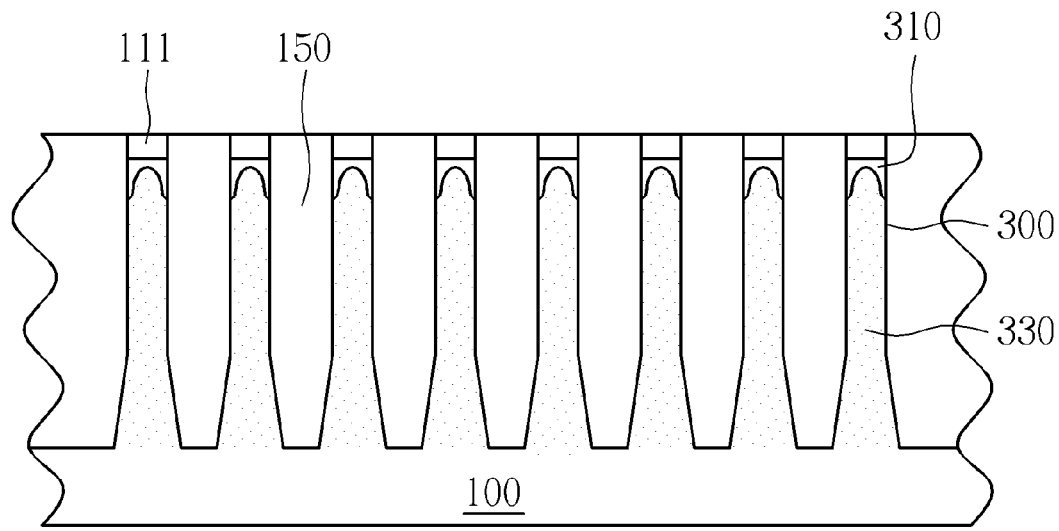

After that, as shown in FIG. 5, a second doped region 330 is formed in the fin structures 300 through a well implantation process. Precisely, the second doped region 330 may be formed by uniformly implanting a second dopant in the whole fin structures, such that the second doped region 330 may function as a well region. Please note that, the aforementioned threshold voltage implantation process P1 and the well implantation process are preferably performed by using the first hard mask layer 111 as an implantation buffering, so as to avoid damaging the fin structure 300 during the implantation process. Also, the second dopant of the second doped region 330 and the first dopant of the first doped region 310 are different in conductive types. For example, in one embodiment of the present invention, the first doped region 310 is an N-typed doped region while the second doped region 330 is a P-typed doped region. However, those skilled in the art would easily realize that it is not limited to having the first dopant being the N-type and the second dopant being the P-type.

Figure 6:
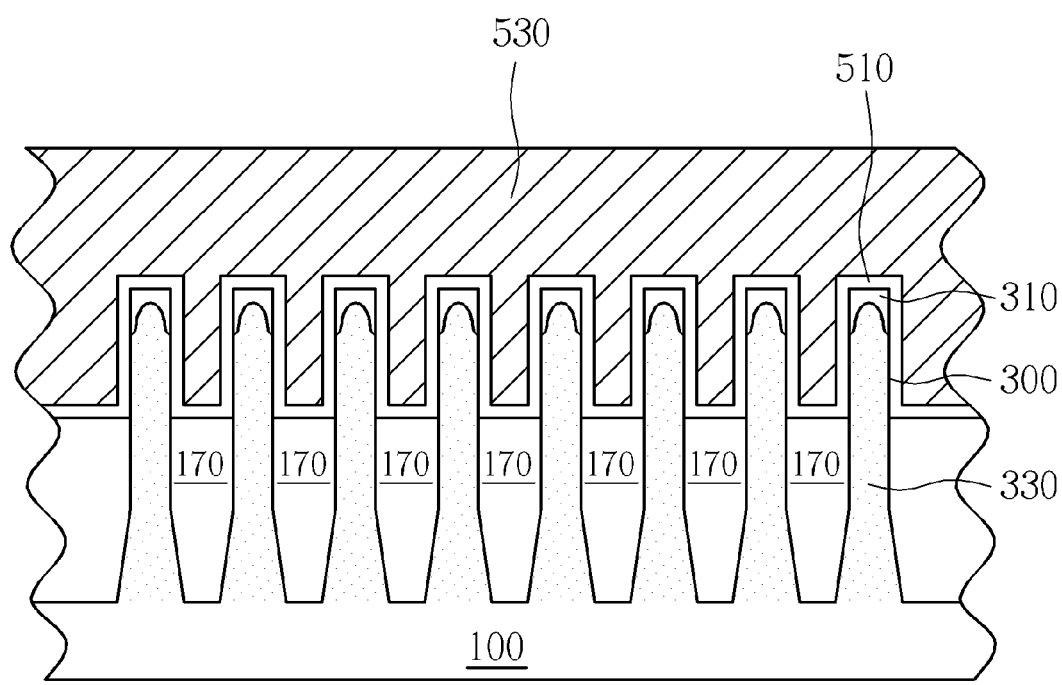
FIG. 6 to FIG. 10 are schematic diagrams illustrating a method of forming a fin shaped structure according to a second preferred embodiment of the present invention.

Following this, as shown in FIG. 6, after performing an etching back process to further remove another portion of the insulation layer 150, an insulation layer 170 is obtained. Then, a gate dielectric layer 510 covering the fin structures 300 and the insulation layer 170, and a gate electrode layer 530 covering the gate dielectric layer 510, may also be formed respectively, for example through a general semiconductor process, wherein the gate electrode layer 530 crosses cover the fin structures 300. It is worth mentioning that, the gate electrode layer 530 of the present embodiment covers a wider region of the fin structures relative to an extended region of the first doped region 310, as shown in FIG. 6. Furthermore, a source/drain region (not shown in the drawings) may also be formed at a portion of the fin structures 300 which is uncovered by the gate electrode layer 530.

Thus, through the aforementioned steps, the fin shaped structure having a preferred electrical property of the first preferred embodiment is obtained accordingly. Since the threshold voltage region (namely, the first doped region) and the well region (second doped region) of the fin shaped structure in the present embodiment are formed by using the first hard mask layer as an implantation buffering, the fin structures of the present embodiment may be easy to keep from being damaged during the threshold implantation. Also, the fin shaped structure of the present embodiment may have preferred sensitivity of threshold voltage, so as to achieve better electrical properties. However, the present invention is not limited thereto.

The following description will detail the different embodiments of the method of forming a fin shaped structure of the present invention. To simplify the description, the following description will detail the dissimilarities among the different embodiments and the identical features will not be redundantly described. In order to compare the differences between the embodiments easily, the identical components in each of the following embodiments are marked with identical symbols.

Referring to FIGS. 7-10, FIGS. 7-10 are schematic diagrams illustrating a method of forming a fin shaped structure according to a second preferred embodiment of the present invention. The formal steps in the second preferred embodiment are substantially similar to those in FIG. 1 to FIG. 3 in the first preferred embodiment and will not be redundantly described. However, it is noted that during the planarization process of the present embodiment, the hard mask layer 110 of the present embodiment is completely removed from the fin structures 300, so as to level the insulation layer 150 with a top surface of the fin structures 300. Next, please refer to FIG. 7, an insulation layer 190 is then formed through performing an etching back process, thereby defining a bottom portion 300a and an exposed portion 300b of each fin structure 300. Precisely speaking, the insulation layer 190 only surrounds each fin structure 300 at the bottom portion 300a thereof to configure as a shallow trench isolation (STI), and the exposed portion 300b of each fin structure 300 is uncovered by the insulation layer 190.

Figure 7:
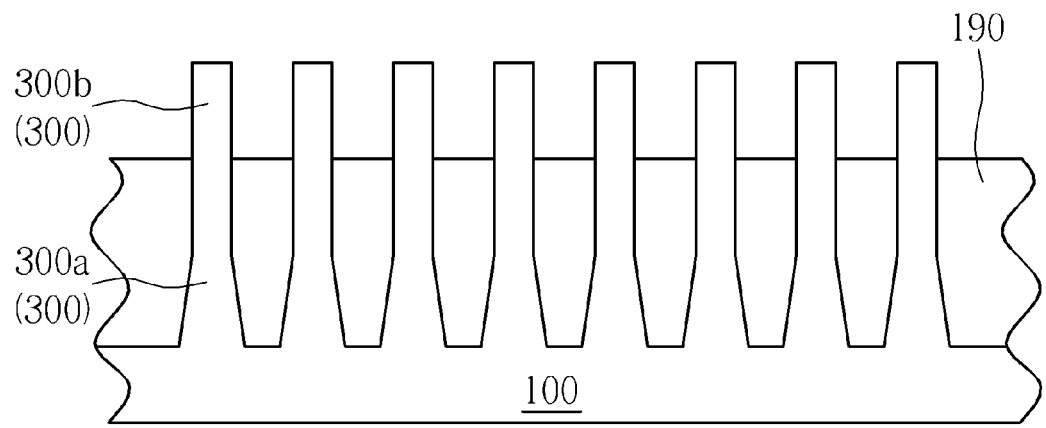

Then, further in view of FIG. 7, a threshold voltage implantation process P2 is performed, to form a first doped region 340 in the fin structures 300 for adjusting a threshold voltage of the fin structures 300. Precisely, before the threshold voltage implantation process P2 is performed, a buffer layer 320, such as a silicon oxide layer, may be optionally formed on the exposed portions 300b of each fin structure 300, for example through an oxidation process, such as an in-situ steam-generation (ISSG) or a chemical vapor deposition (CVD) process, such that the buffer layer 320 may be formed conformally and uniformly on the whole surfaces of the exposed portion 300b of each fin structure 300. Accordingly, the first doped region 340 may be formed by using the buffer layer 320 as an implantation buffering, but not limited thereto. In another embodiment, the buffer layer may also be omitted or be formed via another process.

Figure 8:
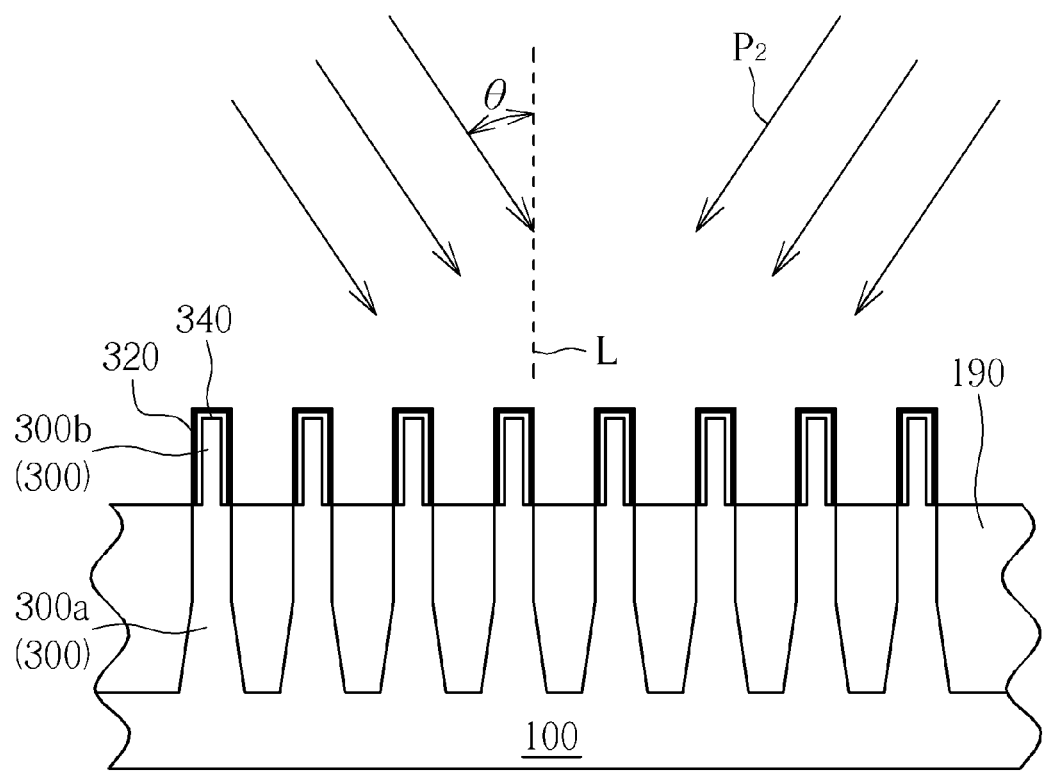

Additionally, the threshold voltage implantation process P2 is preferably performed through a lateral dopant process, for example implanting the first dopant through an angle θ between 5 and 30 degrees with respect to a normal line L, such that the first dopant may uniformly penetrate through the buffer layer 320 on the whole surfaces of the exposed portion 300b, thereby forming the first doped region 340 having an uniform thickness underneath. In this way, the first doped region 340 may also be formed on the whole exposed surface of the exposed portion 300a, right below the buffer layer 320, as shown in FIG. 8. However, those skilled in the art would easily realize the threshold voltage of the present invention it is not limited to be set according thereto, which may also be formed through other suitable processes.

Figure 9:
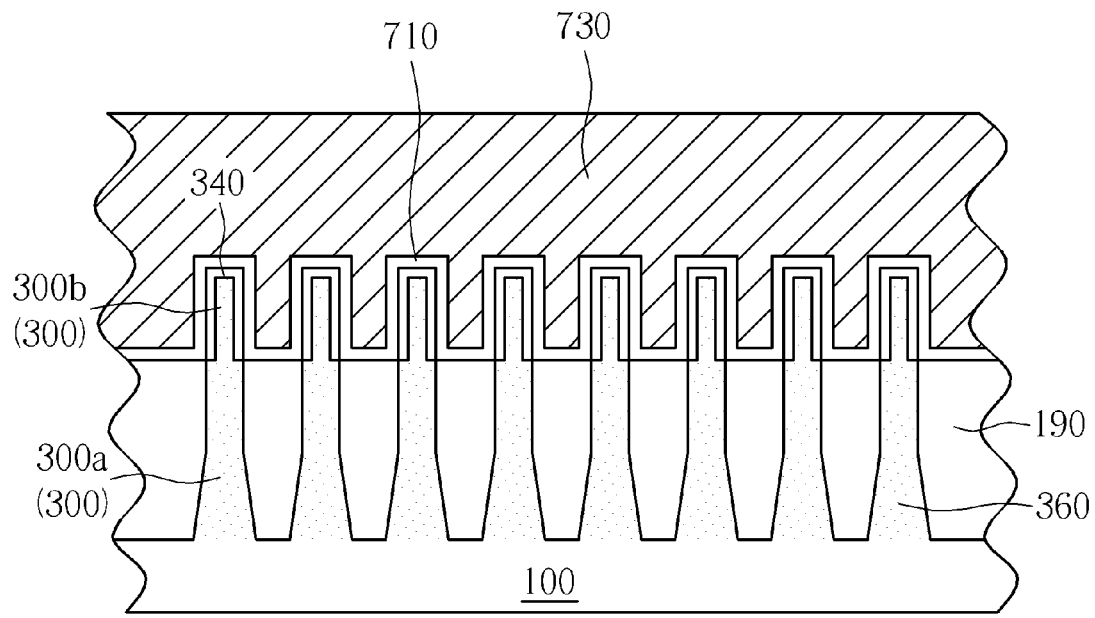
Figure 10:
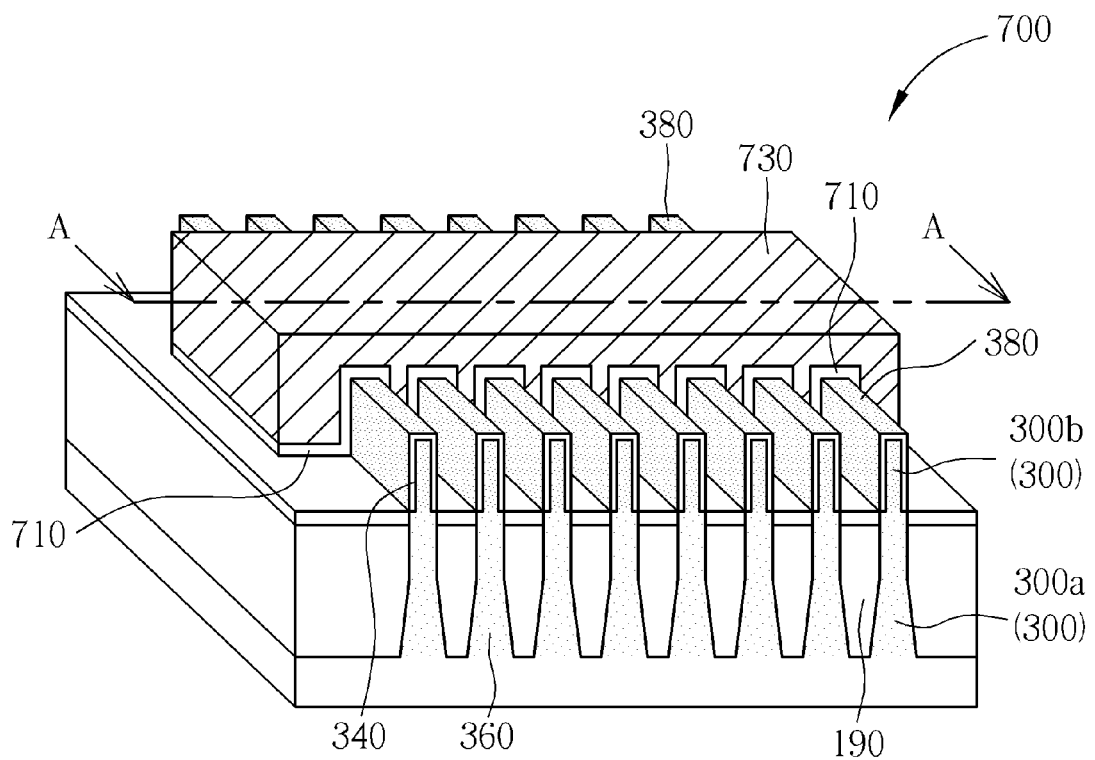

In the following, please refer to FIGS. 9-10, wherein, FIG. 10 is a diagram illustrating the fin shaped structure in one forming step according to the second preferred embodiment of the present invention, and FIG. 9 is a schematic cross-sectional view take along the cross line A-A in FIG. 10. As shown in FIG. 9, after forming a second doped region 360 both in the exposed portion 300b and the bottom portion 300a of the fin structures 300, the buffering layer 340 is removed, and a gate dielectric layer 710 and a gate electrode layer 730 are formed sequentially on the substrate 100 to cover the exposed portion 300b of fin structures 300. Precisely speaking, the second doped region 360 is also formed through the well implantation process as described in the aforementioned first preferred embodiment, such that the second doped region 360 may function as a well region too. Please note that, because of being formed through similar processes, the property and the features of the second doped region 360 are substantially the same to that of the second doped region 330 in the first preferred embodiment, and which will not be redundantly described herein.

Then, further in view of FIG. 9, the gate dielectric layer 710 may include, for example, a silicon oxide layer or a high-k dielectric layer, and is preferably formed after the buffer layer 320 is removed, but not limited thereto. In another embodiment, the buffer layer may remain, so as to function as the gate dielectric layer directly, or to function as a bottom dielectric layer of the gate dielectric layer formed in the follow-up process. Next, the gate electrode layer 730 is formed on the gate dielectric layer 710 to cross over the fin structures 300. The gate electrode layer 730 may include a variety of conductive materials, such as polysilicon or metal. Next, after patterning the gate electrode layer 730 to form the required gate structure, a source/drain implantation process may be carried out to form a third doped region 380, wherein the third doped region 380 is formed at a portion of the exposed portion 300b which is uncovered by the gate dielectric layer 710 and the gate electrode layer 730, as shown in FIG. 10. Preferably, the third doped region 380 may include a dopant having the same conductive type to the first dopant, but in higher doped concentration, but not limited thereto.

Through the above mentioned steps, the fin shaped structure 700 in FIG. 10 can be obtained. In the present embodiment, the threshold voltage region (namely, the first doped region) and the well region (second doped region) of the fin shaped structure are formed by using the buffer layer as an implantation buffering, the fin structures of the present embodiment may be easy to keep from being damaged during the implantation. Furthermore, since the threshold voltage region is formed after performing the etching back process of the insulation layer, the threshold voltage region can be uniformly formed on the whole surface of the exposed portion of the fin structure, so as to achieve the purpose of improving the $V_{th}$ sensitivity, and providing better electrical properties.

Further in view of FIG. 10, the fin shaped structure 700 of the present embodiment includes the fin structure 300 disposed in the substrate 100, with each of the fin structures 300 being surrounded by the insulation layer 190 also disposed on the substrate 100. Wherein, the insulation layer 190 only covers the bottom portion 300a of each fin structure 300 to expose the exposed portion 300b of the each fin structure 300. Namely, the exposed portion 300b of the each fin structure 300 is protruded from the insulation layer 190.

Also, the fin shaped structure 700 further includes the first doped region 340 disposed on the whole surfaces of the exposed portion 300b of each fin structures 300, so as to set a threshold voltage of the fin shaped structure 700. It is worth mentioning that, since the first doped region 340 is formed uniformly on the whole surfaces of the exposed portion 300b, the first doped region 340 has a uniform thickness on the whole surfaces of the exposed portion 300b, thereby achieving preferred $V_{th}$ property.

Furthermore, the fin shaped structure 700 further includes the second doped region 360 disposed in the whole fin structures 300 (including the bottom portion 300a and the exposed portion 300b) and having a different conductive type from the first doped region 340, such that the second doped region 360 can function as a well region. Also, the fin shaped structure 700 also includes the gate dielectric layer 710 and the gate electrode layer 730 stacked on the exposed portion 300b of the fin structure 300 from bottom to top, wherein the gate dielectric layer 710 is directly disposed on the whole surfaces of the exposed portion 300b, and the gate electrode layer 730 is disposed on the gate dielectric layer 710 to cross over the fin structures 300, thereby achieving better electrical performance.

In summary, through the present invention, a fin shaped structure having preferable $V_{th}$ sensitivity may be provided via forming the threshold voltage region after performing the etching back process of the insulation layer and using the buffer layer as an implantation buffering. Thus, the present invention is sufficient to avoid fin structure damage and to achieve improved $V_{th}$ sensitivity and electric properties.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method of forming a fin shaped structure, comprising:
  forming a fin structure on a substrate;
  forming an insulation layer on the substrate and surrounding the fin structure, wherein the insulation layer covers a bottom portion of the fin structure to expose an exposed portion of the fin structure protruded from the insulation layer;
  forming a buffer layer on the fin structure;
  performing a threshold voltage implantation process to penetrate through the buffer layer after forming the insulation layer, to form a first doped region on the exposed portion of the fin structure; and
  performing a well implantation process to form a second doped region in the fin structure after the threshold voltage implantation process, wherein the second doped region is formed both in the exposed portion and the bottom portion of the fin structure and the first doped region is formed on whole surfaces of the exposed portion of the fin structure.

2. The method of forming a fin shaped structure according to claim 1, wherein the first doped region is formed on whole surfaces of the exposed portion of the fin structure.

3. The method of forming a fin shaped structure according to claim 1, wherein, the threshold voltage implantation process is performed at an angle between 5 and 30 degrees with respect to a normal line.

4. The method of forming a fin shaped structure according to claim 1, wherein, after the insulation layer is formed, the buffer layer is formed by performing an oxidation process on the exposed portion of the fin structure.

5. The method of forming a fin shaped structure according to claim 4, wherein, the buffer layer is formed through an in situ steam generation (ISSG) oxidation process.

6. The method of forming a fin shaped structure according to claim 4, wherein the forming of the insulation layer comprises:
    forming an insulation material layer on the substrate, covering both the top portion and the exposed portion of the fin structure; and
    performing an etching back process to remove a portion of the insulation material layer covering the exposed portion of the fin structure, to form the insulation layer.

7. The method of forming a fin shaped structure according to claim 6, further comprising:
    forming a hard mask layer on the substrate; and
    etching the substrate by using the hard mask layer as an etching mask, to form the fin structure.

8. The method of forming a fin shaped structure according to claim 7, wherein the hard mask layer is removed before the etching back process.

9. The method of forming a fin shaped structure according to claim 1, further comprising removing the buffer layer after the first doped region is formed.

10. The method of forming a fin shaped structure according to claim 1, further comprising:
    forming a gate dielectric layer on the exposed portion of the fin structure;
    forming a gate electrode layer on the gate dielectric layer; and
    performing a source/drain implantation process to form a third doped region under the first doped region.

* * * * *